United States Patent [19]

Dahl et al.

[11] 4,305,135
[45] Dec. 8, 1981

[54] PROGRAM CONTROLLED CAPACITIVE KEYBOARD VARIABLE THRESHOLD SENSING SYSTEM

[75] Inventors: Jerome P. Dahl; Phillip R. Epley, both of Raleigh; Jon E. Fox, Cary, all of N.C.

[73] Assignee: International Business Machines Corp., Armonk, N.Y.

[21] Appl. No.: 61,719

[22] Filed: Jul. 30, 1979

[51] Int. Cl.³ ............................ G08C 9/00; G06F 3/00
[52] U.S. Cl. ................................ 364/900; 340/365 C
[58] Field of Search ... 364/200 MS File, 900 MS File; 235/451; 340/365 R, 365 C, 365 E, 365 L, 365 P, 365 A; 324/60 C, 60 CD, 98, 99 R, 57 R

[56] References Cited

U.S. PATENT DOCUMENTS

| | | | |
|---|---|---|---|
| 3,437,795 | 4/1969 | Kuljian | 235/451 |
| 3,720,938 | 3/1973 | Leposavic | 340/365 E X |
| 3,745,536 | 7/1973 | Klehm, Jr. | 364/900 |
| 3,786,497 | 1/1974 | Davis et al. | 340/365 S |
| 3,931,610 | 1/1976 | Marin et al. | 364/900 |
| 4,157,539 | 6/1979 | Hunts et al. | 340/365 C |
| 4,186,392 | 1/1980 | Holz | 340/365 C X |

FOREIGN PATENT DOCUMENTS

| | | |
|---|---|---|
| 2831783 | 2/1980 | Fed. Rep. of Germany . |
| 2311382 | 5/1976 | France . |
| 2332655 | 11/1976 | France . |

OTHER PUBLICATIONS

Fisher, D. E. et al., "Variable Threshold Method for Elimination of Key Bounce" in *IBM Tech. Discl. Bull.*, vol. 17, No. 1, Jun. 1974, pp. 3303-3304.
Williams, J. A., "Touch-Sensing Circuit" in *IBM Tech Discl. Bull.*, vol. 17, No. 1, Jun. 1974, pp. 166-167.
Microprocessor Keyboard Encoding, pp. 67-70 of "Microprocessors" vol. 2, No. 2, Apr. 1978.

*Primary Examiner*—Mark E. Nusbaum
*Assistant Examiner*—John Mills
*Attorney, Agent, or Firm*—Edward H. Duffield

[57] ABSTRACT

A sensing apparatus for detecting impedance changes in a variable impedance matrix keyboard. A microcomputer is utilized to control the basic key intersection scanning and for accurately calibrating and adjusting the sensing threshold of the sense amplifier prior to testing each key intersection so that the effects of stray impedance and varying voltage levels may be compensated for. The micro computer supplies sense amplifier sensitivity threshold selection address codes to set the sensing level for the amplifier. Trial drive pulses are applied to a reference capacitor and are gated to the sense amplifier while the sensing level thereof is varied until no output is obtained. This effectively adjusts the sensing circuits for variable voltage power fluctuations occurring over a short time and compensates for variable capacitive effects not associated with actual key switch movements. The micro computer also has a memory containing known stray capacitance values associated with a given keyboard design and these values are also used to compensate by modifying the sensing threshold above or below the calibrated sensing level achieved. This is done after driving and measuring the capacitance response until a zero output is obtained so that the sensing level may be individually set for each given key in the matrix at that precise level which can provide the highest non-saturating sensitivity level for the amount of stray capacitance known to be associated with the key and for the existing power and capacitance conditions as originally determined by checking the reference capacitor.

6 Claims, 3 Drawing Figures

PROGRAM CONTROLLED CAPACITIVE KEYBOARD VARIABLE THRESHOLD SENSING SYSTEM

FIELD OF THE INVENTION

This invention relates to electronic keyboards in general and to sensing circuits and techniques for capacitive matrix keyboards in particular.

PRIOR ART

Numerous capacitively actuated matrix keyboards exist in the prior art and their use has become widespread in the industry. Such keyboards are disclosed, for example, in U.S. Pat. Nos. 3,786,497, 3,437,795, 3,750,113 or in the defensive publication No. T904008.

In most of the known prior art, coupling between one or more conductive lands or paths on an insulative substrate is capacitively varied by bringing a coupling plate which is dielectrically insulated from the paths or lands into close proximity with the two or more lands. Sensing of the capacitance change is used as an indication of key actuation at a given position in the matrix. Either coupling or decoupling may be sensed as the significant change signaling a key depression.

A recurrent problem with circuits of this type is inherent in the fact that very small capacitance changes on the order of only a pico farad are normally produced. With this small a change in capacitance, the variations in amplifier sensitivities, the varying stray capacitance in the circuit layout and conductors thereof, and the effects of small particles of dirt or contamination that may lie on top of the circuit substrate between the lands and the capacitive coupling plate, may cause erroneous sensing or non-sensing of key actuations. It is most desirable to have the signal sensing point in a key switch actuation occur at approximately the half-way point between the normally open and normally closed positions for maximum protection against the effects of stray capacitance and contamination.

Due to variations in stray capacitance and sense amplifier sensitivity, however, there is a very wide range of levels at which sensing may occur. This means that even slight amounts of dust or contamination may, on a particular key location, result in spacing the coupling plate too far from the lands or contacts on the substrate in the normally closed position. This can result either in continuous sensing of the location as being actuated or in reducing the amount of change in capacitance that occurs to the point that sensing is never accomplished. In addition, stray capacitance inherent in the conductive lines of the circuits involved provides a degree of coupling which is always present so that the net effect of the change at a key location due to key actuation may become small in comparison with the signal continuously present due to stray capacitive coupling effects.

Given a sensing amplifier with a specific sensitivity threshold, the effect of the stray capacitance and the key capacitance must be added together, i.e., the signal sensed at the threshold level of the sensing amplifier is due to stray capacitance plus the variation in key capacitance. Therefore, for a given effective threshold level, the amount of capacitance variation required from the key location is the difference between the threshold sensitivity and the stray coupling capacitance which exists for that location.

The stray capacitive components contribute a signal which tends to mask the effect of key capacitance variations.

In order to eliminate the effects of the various sensing levels due to various amplifiers being used on individual rows or columns of matrix, and to counteract the effects of stray capacitance, individual trimming adjustments, sensitivity controls for the amplifiers and other similar relatively high cost solutions have been proposed. These are, however, generally inconsistent with the high speed, mass production, low cost approach to manufacturing keyboards of this type in volume.

OBJECTS OF THE INVENTION

In view of the foregoing difficulties encountered with keyboards of this type in the prior art, it is an object of this invention to provide an improved technique for varying the sensitivity level for the sense amplifiers in a capacitive matrix keyboard.

A further object of this invention is to provide improved circuitry and apparatus for individually accommodating the effects of stray capacitance associated with each individual key location in a capacitive key matrix.

Still another object of this invention is to provide an improved means and method of simultaneously counteracting the effects of variable threshold sensitivity due to voltage supply fluctuations and component tolerances in sense amplifiers and for the stray capacitance effects for each key location in a capacitive key matrix in a manner that is compatible with high volume automated production techniques for keyboards of the type involved.

SUMMARY

The foregoing and yet other unenumerated objects of the invention are met herein by providing a microprocessor controlled sensing level setting circuit and method for setting a precise sensing level for each key location just prior to addressing that location to detect whether actuation has occurred. A sensing level adjusting routine is utilized under the control of a micro computer embodied with the keyboard circuitry. Each time a new sensing amplifier is selected in the course of scanning the matrix, the routine is conducted. A set of calibration pulses are applied to a precision calibration capacitance connected at the input of the sense amplifier. At the same time, under the control of the micro computer, the sensitivity of the amplifier is varied until a zero output level is achieved. At this point the key sensing system of the amplifier has been accurately calibrated to a controlled switching level which effectively eliminates the variations due to power supply voltage variations, driver transistor supply variations, sense amplifier sensitivity variations and other component tolerances. Also, when a given key location is addressed by the scanning mechanism of the keyboard circuitry, a table of values stored in a memory circuit is accessed for information as to the relatively stray capacitance associated with that key location and the sense amplifier threshold is varied to adjust for the stray capacitance. For example, if a given key location has a high stray capacitance associated with the specific keyboard layout and design of which it is a part, the sense amplifier sensitivity will be made less sensitive (i.e., a higher sensing threshold will be set) and if a low stray capacitance is associated with the key, the opposite variation in sense amplifier sensitivity is made. The threshold sensitivity is varied so that the difference between the threshold sensitivity and the stray coupling capacitance is constant and uniform for all key locations on the keyboard.

By the two procedures described, the variations in the keyboard parameters are effectively compensated for so that the electrical sensing threshold will be reached at a nominal amount of key displacement which is consistent with the degree of physical motion that is achieved by the key actuators so that a switch point is reached in the central region of travel for each switch. This may be considered an optimum for all keys and gives the best tolerances of contamination.

Figure 1:
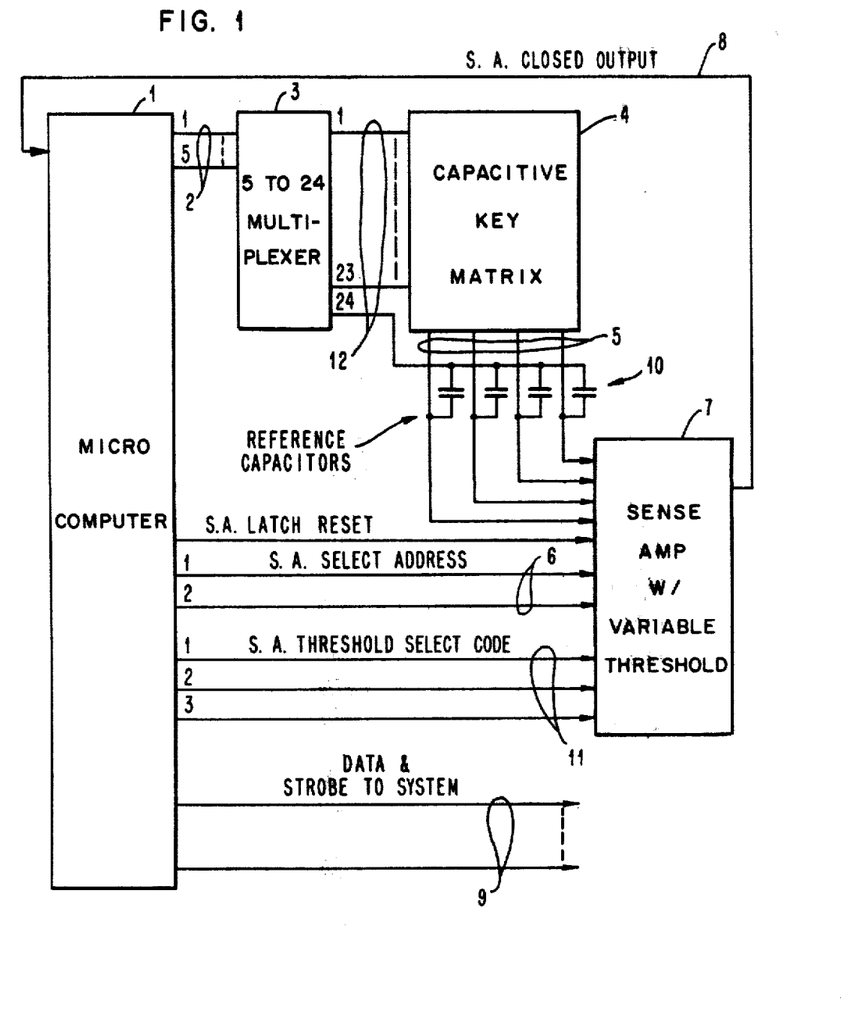
FIG. 1 illustrates an overall schematic block diagram of keyboard logic for a capacitive key matrix sensing system as embodied utilizing a micro computer control for operating the scanning and sensing multiplexer in a manner well known in the art and includes the added features of this invention as well.

Turning to FIG. 1, the overall block diagram for a typical micro computer based keyboard scanning system which also includes the variable threshold setting feature of the present invention is shown. Micro computers for programmable keyboard interface control applications are well known in the art. Keyboard operation encoders and decoders based on the Intel Corporation 8048 micro computer are well known and commercially available. Numerous manufacturers have commercial offerings of complete keyboards based on the use of a single chip micro processor for handling all of the logic for scanning key matrices and providing the coded output when a key is detected as actuated.

As typically known in the prior art, micro computer 1 contains, or may be programmed to execute, a matrix-scanning routine for keyboards which is essentially a closed loop series of instructions which are continuously executed in sequence. Micro computer 1 has a central data processor for executing instructions, a resident non-volatile memory for storing instructions, a data memory which may be writable or fixed, and various input and output ports or pins for receipt and supply of digital signals, power supply, etc., as is well known to those of skill in the art. A number of microprocessor routines may be stored in the non-volatile memory for execution in response to one another and/or to externally applied signals as is customary. These micro routines, as they are known, are logical functions that can be written as desired by programmers given the instruction set and format for a given microcomputer once the desired outputs and internal logical sequence of events are known. These details, being completely known from specifying the desired output function and timing thereof relative to other desired operations or logically responsive thereto, need not be described here for they form no part of this invention in its broadest sense. They depend on the specific microcomputer employed and are obvious to any skilled programmer faced with the task of implementing the desired input/output and data processing functions once the latter are specified to him. Outputs are provided on various output pins and can represent, in many instances, what is effectively a series of variable binary counts. For example, on the output lines indicated as 2, the microcomputer 1 provides five binary bits which are decoded in multiplexer 3 to drive 1 out of 24 lines supplying signal pulses on any one of the 24 rows connected in a key matrix 4 to each of the key in a given row. The outputs are provided on any of the columns 5 which intersect the rows when a key at a given intersection is actuated. It is possible to directly drive the rows with individual signals on separate output ports from microprocessor 1 if sufficient output ports are provided. If this is done, the multiplexing by decoding an address to a single output line is done internally and is handled by a microcode routine within the microprocessor. It is slightly less expensive to construct the keyboard in this way since the hardware module 3 can be eliminated. If this were done, FIG. 1 would appear the same except that multiplexer 3 would be removed and the output lines originally used to drive it would be increased in number and connected directly to the rows in matrix 4. Either embodiment is therefore understood to be described by FIG. 1. This latter variation is not generally found in the prior art and represents a departure therefrom. Of course, the same variation is possible for driving the selection gates or decoder function by supplying direct outputs, provided sufficient pins are available on the microprocessor, to the selection gates connected to the columns and thereby selecting which column is connected to the sense amplifier.

Generally, each individual output column may be supplied with its own control-gated sensing amplifier or, as in the present embodiment, with a control gate for connecting it to a common sensing amplifier. The sense amplifier gating selection to route signals from a given column to a common sense amplifier is accomplished by microcomputer 1 supplying on lines 6 a sense amplifier selection or gating address. Since only four columns are shown in the present embodiment, two binary bits are all that are necessary to select any one of the four columns by applying the sense amplifier selection address to the sense amplifier selection circuitry 7 where the two bits on line 6 are decoded to gate one of the columns 5 to a given sense amplifier.

When a sense amplifier is detected as "closed," i.e., when a key signal is produced which indicates that a key is depressed, a feedback on line 8 indicative of key detection is supplied in microcomputer 1 which will then supply on its output 9 a multi-bit data and strobe signal to the using system in a manner well known in the art. This data output can be the binary count made up of the bits on lines 2 and 6 which uniquely identifies any given position in the capacitive key matrix 4 or it can be further encoded in a memory contained in microcomputer 1 to any desired format. These features, being commonly available in the marketplace and not a portion of this invention, are not described further herein. In addition, the data memory of microcomputer 1 may contain other information associated with each individual key in the matrix such as a stray capacitance value address or factor, and any logical attributes assigned to a key such as typamatic (automatic repeat) functions case shift or font identifications, or control functions having significance in a data memory entry system.

Other elements are incorporated in FIG. 1 which are also not found in the prior art. Specifically, reference capacitors 10 are shown as being coupled between one of the output lines from multiplexer 3 and each of the colums 5 from the capacitive key matrix so as to supply pulses at a referenced capacitive coupling level to the inputs in the sense amplifier box 7. While several reference capacitors are shown, in practice only one need actually be used because the capacitive variations in the columns or rows on a given keyboard are negligible and the sensitivity of the amplifier and the component tolerances, once accounted for by a single reference capacitor, do not vary. The single reference capacitor is necessary, however, since circuit chips or modules are currently employed to construct the circuits and the variations from chip to chip must be accounted for. The reference capacitor drive effectively calibrates the existing component tolerances to an acceptable sensing level that will differ from circuit to circuit but will vary only very slightly within a given circuit. The calibration sequence described below should be performed periodically to account for power supply variations and thermal effects, but the frequency of recalibration is arbitrary. The reference capacitor or capacitors need be driven once at startup and then at relatively infrequent periods thereafter. Recalibration can be performed at the end of each key scanning sequence, or every second, or minute or ten minutes, etc. under the control of the microprocessor. Or, as is done in the present embodiment, the recalibration sequence can be done on a regular periodic basis by making in a part of the key scanning sequence.

As will be described further herein, and as is apparent from the fact that the last output from multiplexer 3 is connected to the capacitors 10, each time a new sense amplifier is selected (i.e., once a complete count has been generated in a cycle and the final output from multiplexer 3 has been achieved) the next bit in the count will select a new sense amplifier address. The sense amplifier bits on lines 6 are the two highest order counts in a multi-bit address count indicative of a given matrix location and the low order bits are those on lines 2.

The sense amplifier threshold is varied according to the present invention under the control of microcomputer 1 until no output is any longer detected whenever the reference capacitors 10 are supplied with a pulse from multiplexer 3. The sense amplifier threshold is controlled by a selection address supplied on lines 11 from microcomputer 1 and is accommodated in the sense amplifier selection and variable threshold circuit block 7.

Figure 2:
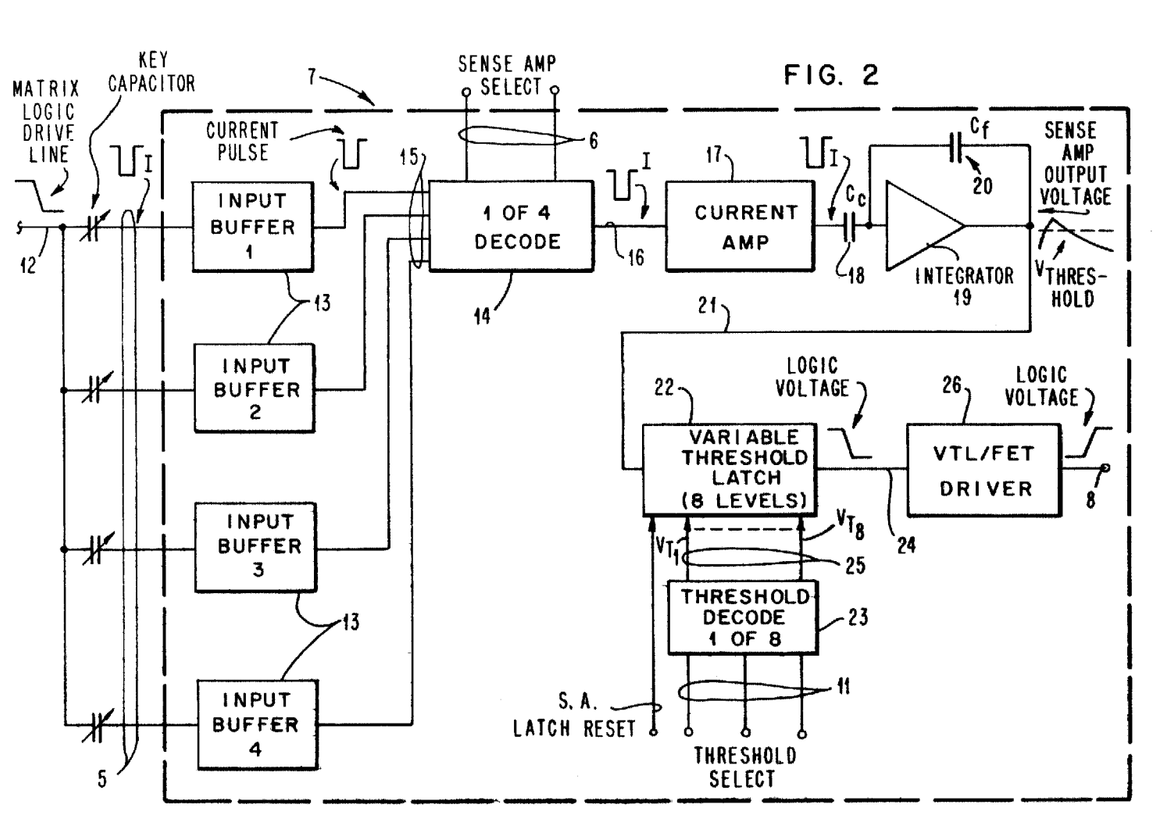
FIG. 2 illustrates an electrical logic diagram illustrating the various components employed for varying the sensitivity of the sensing amplifier under micro computer control which is generally indicated in FIG. 1.

Turning to FIG. 2, a more detailed block diagram for what is contained in box 7 in FIG. 1 is shown.

In FIG. 2, drive pulses from multiplexer 3 are supplied on one of the lines 12 to the group comprising all of the four key capacitors in a given row as schematically shown in FIG. 2. The output lines 5 are supplied to the input buffers 13 contained within logic block 7. These buffers 13 provide a very low impedance interface for the signal current pulses coming on any of the lines 5 and supply them to the input of the sense amplifier selection gate 14 which decodes the sense amplifier selection signals on line 6 to select and gate only one of the four input lines 15 as shown. The output from the decoder 14 is supplied on line 16 to a current amplifier 17 which amplifies the current pulse. A DC isolation coupling capacitor 18 then supplies the signal from current amplifier 17 to a current integrating amplifier 19 which has a feedback coupling capacitor 20 of a type well known in the art to provide the integrated current signal. This produces a wave shape similar to that shown in the small diagram near the output line 21 which effectively reconstructs the shape of the driving voltage pulse in a sawtooth waveform as shown. This is supplied on line 21 to a variable threshold selection gate 22.

Selection gate 22 selects any one of 8 levels, for example, under the control of the selection lines 25 coming from the decoder 23. Decoder 23 is supplied with the variable threshold selection levels on lines 11 from microcomputer 1 as illustrated on FIG. 1. Any one of 8 output levels is selected by decoder 23 in accordance with the binary count on lines 11. The variable threshold latch 22 then adjusts the threshold to a preset level and will not trigger until that level on line 21 exceeds the threshold. When the threshold sensing level is reached, an output 24 from the threshold latch 22 is supplied to a transistor driver circuit 26 which supplies the detection signal on line 8 as shown in FIG. 1 indicating that an activated key location has been sensed. A sense amplifier latch reset signal is provided on the reset line by microprocessor 1 at startup and at other times when it may be necessary to reset the latch 22.

As stated previously, the effective threshold level at which switching will be detected is represented by the difference between the threshold sensitivity of the sensing amplifier and the amount of stray coupling capacitance that exists for a given key location. That is, for a given sensitivity threshold on the sensing amplifier, a certain amount of incoming signal will be continuously present as a result of stray capacitance and only a small additional amount, equal to the difference between the threshold sensitivity and the stray coupled input signal need be supplied by varying the key capacitance at that location.

Table 1 below indicates the effective sensitivity threshold as expressed in picofarads instead of in volts or amps, it being understood that the input sensitivity is actually a voltage threshold which would be achieved by varying an input signal by means of a capacitance measured in picofarads. Table 1 presents the base threshold sensitivity in picofarads versus the stray capacitance in picofarads and represents the effective threshold as the difference is picofarads between these two values. It may be seen that, for a nominal input sensitivity in the one picofarad range, the stray capacitance may range from 0.2 to 0.5 picofarads and the effective sensitivity level may vary from 0.5 to 0.8 picofarads, accordingly. This means, that for a 0.5 picofarad stray capacitance level, only a 0.5 picofarad change at the key location will be necessary to reach the sensitivity threshold of the sensing amplifier if it is set at one picofarad. Therefore, slight movements, the presence of contamination on the capacitive plates or variations in power supply voltage may result in spurious detection of key actuation which has not actually occurred. At the other end of the scale, given a stray coupling capacitance of only 0.2 picofarads, it may be necessary to produce a 0.8 picofarad change at the key location in order to create enough signal to be sensed. This may not be actually achieved in practice by certain keys. The result would be that detection of that key location is not possible at the given amplifier input sensitivity threshold.

TABLE 1
EFFECTIVE THRESHOLD

|  |  | Range of Amp Sensitivity in pF | | | | |
|---|---|---|---|---|---|---|
|  |  | .8 | .9 | 1.0 | 1.1 | 1.2 |
| Range of Stray in pF | .5 | .3 | .4 | .5 | .6 | .7 |
|  | .4 | .4 | .5 | .6 | .7 | .8 |
|  | .3 | .5 | .6 | .7 | .8 | .9 |
|  | .2 | .6 | .7 | .8 | .9 | 1.0 |

Table 2 illustrates a binary address table in correspondence with a set array of input amplifier threshold sensitivity levels expressed in picofarads. The decoder 23 in FIG. 2 will respond to the binary input addresses shown in Table 2 to select one of the eight output threshold sensitivity levels in the variable threshold latch 22 as depicted by the values of Table 2. A 1 picofarad input reference capacitor 10 can be effectively sensed over a range of input sensitivity thresholds of 0.8 to 1.2 picofarads as shown in the bracketed area of threshold sensitivity in Table 2. The importance of this will become apparent.

TABLE 2
Address VS. Base Threshold of Variable Threshold Sense Amp

| Address | Threshold | | | |
|---|---|---|---|---|
| 000 | 0.6 | ± | 0.2 | pF |
| 001 | 0.7 | | " | |
| 010 | 0.8 | | " | |
| 011 | 0.9 | | " | |
| 100 | 1.0 | | " | |
| 101 | 1.1 | | " | |
| 110 | 1.2 | | " | |
| 111 | 1.3 | | " | |

Range of Address For 1 pF Reference Capacitor (rows 010–110)

As stated previously, in order to compensate for the effects of variable sensing levels due to component tolerances, power supply variation, etc., a precise reference capacitor 10 is placed at the input for each sensing amplifier and, although any arbitrary recalibration frequency will suffice, it is supplied with drive signals from a common driver line 12 each time a new sense amplifier is selected by the high order count bits on lines 6. These are affected each time the low order count bits on line 2 have counted up to their maximum and an output is produced on the final line 12 to the reference capacitors 10 as shown in FIG. 1.

A drive signal pulse is applied by a common driver on line 12 to all of the reference capacitors and at the same time, the selected sense amplifier threshold is increased by changing the count on lines 11 until no signal output on line 8 is sensed. When this point is reached, the key sensing system is calibrated to a 1 picofarad variation or switching level, assuming that 1 picofarad reference capacitors are used as capacitors 10. In this manner, whenever a new sensing amplifier is selected, the present conditions for power supply voltage, driver voltage, sense amplifier sensitivity and component tolerances are all recalibrated, readjusted or compensated for by setting the sensing level of the amplifier for the existing conditions to be triggered at a threshold greater than that of a 1 picofarad change in capacitance on the input line.

In addition, prior to going through the scanning procedure to sense whether any keys are actuated each time a new sense amplifier is selected, there is a range of stray capacitance values associated with the specific type of capacitive matrix layout, i.e., the number, size and location of the keys relative to one another. Stray capacitance varies significantly from key to key but does not vary significantly from one keyboard to the next, provided that the same physical layout is employed. Therefore, the stray capacitance values associated with each of the key locations in a capacitive matrix are stored in a read only memory embodied in the microcomputer 1. Table 3 shows a typical range of values for stray capacitance which are given in association with a threshold modification address factor. A nominal stray capacitance of 0.4 picofarads is normally encountered and no adjustment is made in the scheme given as the illustrative example herein whenever 0.4 picofarads of stray capacitance exists. This will be described in some detail later.

The address factors associated with the stray picofarad values in Table 3 are utilized in microcomputer 1 to further adjust the sensitivity threshold which has been adjusted to the reference capacitor calibration level as previously described. If a higher than normal stray capacitance is achieved at a given key location, the address at the sense amplifier threshold selection lines 11 is increased by one binary count to decrease the sensitivity of the amplifier (i.e., raise its sensitivity threshold) and the opposite case is achieved in the event that lower than the 0.4 nominal picofarads stray capacitance exists by subtracting or decrementing the binary count on lines 11 as shown by the values in Table 3.

TABLE 3
KEY STRAY FACTORS

| Stray | Factor |
|---|---|
| .5 pF | +001 |
| .4 | 000 |
| .3 | −001 |
| .2 | −010 |

By the procedures just described, variations in the keyboard may be compensated for and the effective sensing threshold will be 0.6 picofarads which is the nominal 1 picofarad calibration level minus the nominal 0.4 picofarad stray capacitance level. In an operative keyboard embodiment, this gives an air gap in the moving coupling plate to fixed coupling plate measuring distances of approximately 0.2032 millimeters for a given embodiment for all keys.

Figure 3:
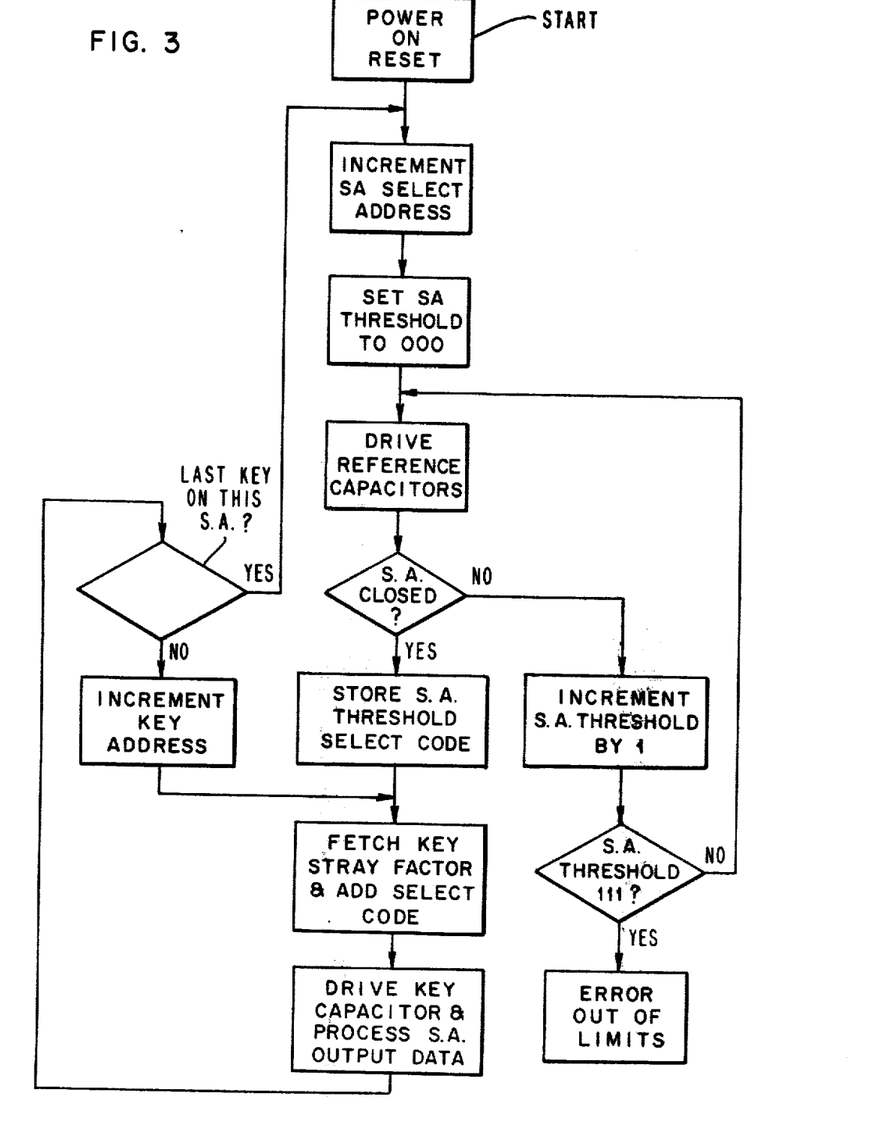
FIG. 3 illustrates the basic flow diagram for the programming logic involved for programming the micro computer to accommodate the variable sensitivity setting routine.

Turning to FIG. 3, the schematic flow chart of the microcomputer program utilized for calibrating and later adjusting the sense amplifier threshold is shown. Beginning at the start, a power on reset operation is conducted followed by an incrementation of the sense amplifier selection address to set the sense amplifier threshold to the value achieved by the binary count 000. As may be seen from Table 2, this effectively sets the input threshold at 0.6 picofarads nominal sensitivity level for a 1 picofarad reference capacitor on its input. Next, the reference capacitors are supplied with a drive signal by outputting the count on lines 5 from microcomputer 1 in FIG. 1 which will, when decoded by multiplexer 3, provide an output on the last line which is connected to the reference capacitors 10 as shown. If a feedback indicative of the sense amplifier detecting a signal is supplied on line 8, the microcomputer can determine whether the sense amp is detected as closed. Depending on whether the amplifier is detected as closed or open, the yes-no determination block following driving of the reference capacitors is executed. In the event that the sense amplifier is detected as closed, i.e., no output is detected, the sense amplifier threshold is stored in a storage register of microcomputer 1 and the key address stray capacitance factor associated with the first key to be scanned is fetched from memory and added in a working register to the value from the storage register. The result represents the new sense amplifier threshold level. Then the key capacitor is driven during its scanning cycle as shown in the flow chart of FIG. 3. If the key happens to be the last one connected to a given sense amplifier, a decision is made to increment the sense amplifier selection address, but if it is not the key which is last in connection with a given amplifier, the key address is incremented and the key address stray capacitance value is fetched and added to the adjusted sense amplifier threshold level until all of the keys associated with a given sensing amplifier have been scanned.

When the last key on a given sense amplifier has been sensed, the sense amplifier address is changed to select a new sense amplifier and the sense amplifier calibration routine used in driving the reference capacitor is conducted as previously described. In any of the calibration routines, if the sense amplifier indicates that it is detecting an input signal, then the sense amplifier is not closed and an output is produced on the "NO" line from the "sense amplifier closed" decision block in FIG. 3. This results in incrementing the sense amplifier threshold address by one. Then a comparison is made to determine whether the maximum sense amplifier threshold address has been reached. If the maximum sense amplifier threshold address is reached, an error condition out of limits of adjustment is indicated. If the sense amplifier threshold is not the maximum, the decision block reenters the program loop to drive the reference capacitors again to determine whether or not the zero output or sense amplifier closed condition has been achieved. When this condition is achieved, the address threshold level is stored and the routine for scanning the keys is conducted as previously described.

The specific program steps to be written in microcode instructions for a microcomputer in order to execute the routine as described in FIG. 3 are apparent to any of those skilled in the art. And, since the specific code instructions for any given microcomputer are dependent upon the capabilities, design and operation of the microcomputer and these are supplied by the vendors thereof, they do not form a part of this invention.

In an operative keyboard embodiment, these sensing levels correspond to an air gap switching point in the travel of a capacitive coupling plate above two coupling pads of approximately 0.2032 millimeters. This air gap of 0.2032 millimeters is a compromise of satisfactory air gap and maximum capacitive variation.

The scanning routine described previously operates to scan all of the rows intersecting a given column, then gated by one of the amplifier selection gates. The inverse operation is also possible in which each of the gates is selected in sequence before a new drive signal is produced. That is, scanning can proceed row by column by column or column by row by row. In the present embodiment, due to the reference capacitors being connected one per column and all in one row as shown, it is more convenient to calibrate to the reference for a column and then sequentially scan all of the rows which intersect it by applying the appropriate codes to the multiplexer 3. It is also possible, as noted above, to directly apply drive pulses from the output ports of microprocessor 1 and eliminate the muliplexer 3 entirely.

Returning to FIG. 3, a detailed example of the basic flow diagram for the programming logic involved for the microcomputer to accommodate this variable sensitivity setting routine will be briefly described. In FIG. 3, start up generates a reset function for all registers known as the power on reset or initialize function commonly employed with programmed machines. The sense amp selection address register is then incremented and the sense amp threshold is set to 000. This corresponds to a 0.6±0.2 picofarad threshold. The reference capacitors are then driven by supplying an output on the reference capacitor drive line, the last output from multiplexer 3 shown in FIG. 1. A test is then made to determine whether the sense amp 7 has detected a pulse. If the sense amp has detected a pulse, then it has not detected what it recognizes as a key closure in which very little energy is transmitted. If the sense amp has not, therefore, detected the closure, (or what it is instructed as a closure of a key switch which corresponds to opening of the capacitive coupling plates), the sense amp threshold is incremented by one and a check is made as to whether the maximum threshold has been reached. If the maximum threshold has not been reached, the reference capacitor is again driven and a check is made to determine whether the sense amplifier has detected a key as closed (i.e., no pulse). The routine contines until finally the sense amplifier detects what it interprets as a key closure and the then existing sense amp threshold address is stored. The routine then fetches the key stray capacitance factors stored as ROM or ROS for the key location in a keyboard of a given array and design. These factors, as previously noted, vary considerably from key position but not at the same position for a given layout of keys so that the ROM or ROS may be programmed for a given configuration of keys used in a typical keyboard layout. When this operation is complete, then the instruction is executed to drive the signal for the key capacitor and do a key scanning cycle. A check is made to determine whether the key last scanned was the last key connected to a given sense amplifier. If it is the last key, then a new loop of execution instructions is entered to increment the threshold setting operation prior to continuing the scan. If it is not the last key connect to a given sense amplifier, then the key addres is incremented and the key stray capacitance factors are fetched for that key and another drive and scan cycle are entered as depicted in FIG. 3.

An error or out of limit condition is indicated in the event that the sense amp threshold reaches the maximum without detecting a key closure during the reference setting threshold operation described earlier.

A complete set of instructions for any given microprocessor can easily be generated by any programmer skilled in the art from the reference manuals and instructions provided by the vendors of the microprocessors. Because of this, no detailed list of the microprogram instructions for executing the routine depicted in FIG. 3 is given herein. The instructions and a specific program contemplated by FIG. 3 as illustrative of the best mode of embodying the threshold setting and testing routine employed in the present scanning method of the present invention are independent of the specific micro instructions that may be necessary for a given microprocessor in order to enable it to carry out the routine, the method and function being adequately described by the flow chart of FIG. 3. Microcode instruction lists will be readily available to those of skill in the art faced with the task of programming given microcomputers. They are supplied by the company which sells the machines.

Having thus described our invention and a preferred embodiment thereof, together with the best mode contemplated for the carrying out thereof, it will be apparent to those of skill in the art that other microprogram routines for testing and setting a sense amplifier threshold in a tailored fashion responsive to the results of a sensitivity test on a given key location or sense amplifier can be easily written without departing from the spirit and scope of this invention. For example, higher speed or multiprocessor embodiments can be easily envisioned in which one function of the portion of the microprocessor will be to test and set the sense amp sensitivity threshold while another portion or another microprocessor is busy conducting a scan routine to detect closed keys using the values from a previously set threshold from a prior execution in the first microprocessor section. Such overlapped or parallel operative routines are commonplace and do not depart except in the time of execution from the basic concepts and scheme of preliminary testing and setting of the sense amplifer threshold followed by a scanning of the keys connected to that given sense amplifier as disclosed herein. Also, while the invention has been described with reference to a capacitive variable impedance element matrix keyboard, other variable impedances such as resistors and inductors may be similarly employed to the same effect. Capacitors were chosen for the preferred embodiment because they suffer from fewer electrical noise problems and are somewhat less expensive and are easier to fabricate than resistive or inductive devices. Similarly, optical devices are well known equivalents for the variable impedance devices and embodiments using this technology are readily apparent in the keyboard arts.

Having thus specifically described our invention, what we desire to protect by Letters Patent is described in the following claims.

We claim:

1. In a data entry keyboard apparatus having a matrix array of variable state keys arranged in intersecting rows and columns, said keys each being responsive to a change of state thereof for affecting a signal change between a given row and column at the intersection thereof, said keyboard apparatus having a programmed micro computer having at least one signal input port and a number of signal output ports, said keyboard apparatus having a multiplexer means having inputs and outputs connected at its inputs to said micro computer at a first plurality of said output ports thereof and responsive to signals therefrom for providing at outputs of said multiplexer drive signals on only one row or column of said matrix array, and said keyboard apparatus having decoder means having inputs and outputs with its inputs connected to a second plurality of said output ports of said micro computer and responsive to signals therefrom for gating at the outputs of said decoder a signal output from only one said column or row respectively in said matrix array, said micro computer being programmed to sequentially scan said matrix array at the intersections between rows and columns thereof to determine whether any of said variable state keys have had their state changed to affect a signal change between any row and column, said scanning being conducted row by column or column by row by said micro computer providing at said first plurality of output ports thereof to said multiplexer means a coded signal comprising a number bits for controlling which output of said multiplexer will receive a said drive signal and by sequentially providing at said second plurality of output ports to said decoder means a multi bit coded signal for controlling which of said columns or rows respectively in said matrix array will have signals gated out therefrom, the improvements comprising:

at least one fixed electrical reference impedance arranged to form one said row or column in said matrix array, said reference impedance being scanned periodically in the same fashion as said matrix array intersections between rows and columns are scanned;

at least one variable threshold electrical signal amplifier means having a signal input and an output, said input thereof being connected to receive the outputs gated from said matrix array by said decoder means, said amplifier means being for amplifying said drive signals applied thereto which are above the threshold thereof and passing said amplified signals to said output thereof, said output being connected to said input port of said micro computer;

said variable threshold amplifier means having a plurality of address inputs separate from said signal input, said address inputs being connected to a third plurality of output ports of said micro computer, and said amplifier means having means for changing the amplification threshold level thereof responsive to the receipt of a threshold level setting address received at said address inputs thereof;

said amplifier means providing at its output connected to said microprocessor at said input port thereof an indication that a signal above the threshold level of said amplifier means has been detected and amplified by said amplifier means;

said micro computer being programmed to provide through said multiplexer a drive signal to said reference impedance at least once and to provide a drive signal again to said reference impedance each time that a signal responsive to said application of a drive signal to said reference impedance is detected and amplified by said amplifier means and provided to said input port of said micro computer;

said micro computer being programmed to provide at a third plurality of said output ports thereof a threshold setting address, said third plurality of output ports being connected to said address inputs of said variable threshold amplifier means for chaning said threshold level thereof, said threshold setting address being changed by said micro computer each time that a said reference impedance drive signal has been provided by said multiplexer and a signal from said amplifier means has been received at said input port of said micro computer;

said micro computer having a data memory means in which information is stored with each intersectional position in said matrix array identified by the unique row and column designations thereof, said information comprising a coded representation of the significance in data entry of the said variable state key located at said matrix array intersection, a stray impedance factor associated with each said key and any other functional attributes assigned to said key;

said micro computer being programmed to access said data memory means for said data associated with each said key identified by said matrix array intersectional position identified by said unique row and column designation each time that said intersection is scanned; and said micro computer being programmed to store said threshold setting address signal last provided to said multiplexer to drive said reference impedance and, at each scan of each said intersection in said matrix array, said micro computer being programmed to add said stray impedance factor from said data memory means associated with said identified matrix array intersectional position to said threshold setting address to provide a new combined threshold setting address for each said identified matrix array intersectional position just prior to the time said multiplexer provides a said scanning drive signal thereto.

2. Apparatus as described in claim 1, wherein: said variable state keys in said matrix array each comprise a variable capacitive impedance means which affects and modifies the amplitude of a signal applied thereto on a given row or column and couples said signal to an intersecting column or row, respectively, in said matrix array.

3. Apparatus as described in claim 1 or claim 2, wherein:
said micro computer is further programmed to provide after each new selection of an output gate from said matrix array, a coded signal to said multiplexer for driving said reference impedance.

4. Apparatus as described in claim 1 or 2 wherein:
said micro computer provides said coded signals directly from output ports of said microprocessor to said matrix array for scanning thereof.

5. Apparatus as described in claim 1 or 2 wherein:
said micro computer is programmed to provide said coded signal directly to a said column or row, respectively, for said scanning of said keys in said matrix array.

6. Apparatus as described in claim 1 or 2, wherein:
said reference impedance is provided at the end of a said column or row farthest removed from the input point for drive signals applied thereto, and each said column or row is provided with a similar reference impedance means.

* * * * *